United States Patent [19]

Obara et al.

[11] Patent Number: 5,349,351
[45] Date of Patent: Sep. 20, 1994

[54] ANALOG-DIGITAL CONVERTING DEVICE

[75] Inventors: Sanshiro Obara, Tokaimura; Mitsuru Watabe, Ibaraki; Rika Minami; Shigeki Morinaga, both of Hitachi, all of Japan

[73] Assignee: Hitachi, LTD, Tokyo, Japan

[21] Appl. No.: 940,332

[22] Filed: Sep. 3, 1992

[30] Foreign Application Priority Data

Sep. 3, 1991 [JP] Japan ............................... 3-222952

[51] Int. Cl.⁵ .................... H03M 1/12; G05B 11/28
[52] U.S. Cl. ............................ 341/141; 318/599; 318/811
[58] Field of Search ............... 341/141, 155; 318/254, 318/599, 811

[56] References Cited

U.S. PATENT DOCUMENTS

| | | | |
|---|---|---|---|
| 4,050,062 | 9/1977 | Crocker et al. | 341/141 |
| 4,346,434 | 8/1982 | Morinaga | 318/341 X |
| 4,719,400 | 1/1988 | Kurakake et al. | 318/811 |
| 4,933,676 | 6/1990 | Hauge et al. | 341/141 |
| 4,969,080 | 11/1990 | Kawabata et al. | 363/41 |
| 5,171,960 | 12/1992 | Takano et al. | 219/108 |
| 5,172,116 | 12/1992 | Noma | 341/141 |
| 5,212,483 | 5/1993 | Wakimoto | 341/141 |
| 5,241,250 | 8/1993 | Nagasawa et al. | 318/591 |

*Primary Examiner*—Sharon D. Logan
*Attorney, Agent, or Firm*—Antonelli, Terry, Stout & Kraus

[57] ABSTRACT

An analog-digital converting device is designed such that when an operation of converting a special analog signal into a digital signal and an operation of converting another analog signal into a digital signal are instructed concurrently, priority is given to the conversion operation of the special analog signal, The analog-digital converting device includes an analog multiplexer having a main channel and a sub channel, a sample holder, an AD converter, a conversion result register having a plurality of storage areas, and an AD control circuit for controlling the drive of the individual components according to an instruction of a CPU. When the analog signals input to the channels are converted into digital signals in sequence, priority is given to AD conversion of the analog signal input to the main channel over AD conversion of the analog signal input to the sub channel.

12 Claims, 14 Drawing Sheets

FIG. 4

| BIT | NAME | CONTENTS |
|---|---|---|
| 15 | ADSTPWM | INITIATION AND STOPPAGE OF AD CONVERSION BY PWM TRIGGER OR SOFTWARE SETTING |
| 14 | ADSTNRM | INITIATION AND STOPPAGE OF AD CONVERSION BY EXTERNAL TRIGGER OR SOFTWARE SETTING |
| 13 | TRGPWM | SELECTION OF PWM TRIGGER OR SOFTWARE SETTING OF ADSTPWM |
| 12 | TRGNRM | SELECTION OF EXTERNAL TRIGGER OR SOFTWARE SETTING OF ADSTNRM |
| 11 | CH1PWM | DESIGNATION OF NUMBER m OF INPUT CHANNELS FOR SCAN CONVERSION OPERATION BY ADSTPWM WHEN CH0 THROUGH CHm OPERATION IS CONDUCTED IN THE ORDER OF CH0 THROUGH CH7, m=3 |
| 10 | CH0PWM | |
| 9 | CH2NRM | DESIGNATION OF INPUT CHANNEL k OF THE SINGLE CONVERSION OPERATION BY ADSTNRM $m+1 \leq k \leq 7$ IN THE CASE OF CH4, k=4 |
| 8 | CH1NRM | |
| 7 | CH0NRM | |
| 6 | PWMADiE | ENABLE OR INHIBIT OF INTERRUPT WHEN AD CONVERSION BY ADSTPWM IS COMPLETED |
| 5 | NRMADiE | ENABLE OR INHIBIT OF INTERRUPT WHEN AD CONVERSION BY ADSTNRM IS COMPLETED |

FIG. 8

| CHANNEL | CH×PWM(0,0) m=0 | CH×PWM(0,1) m=1 | CH×PWM(1,0) m=2 | CH×PWM(1,1) m=3 |
|---|---|---|---|---|
| CH7 | | | | |
| CH6 | | | | |
| CH5 | ADDRE | ADDRE | ADDRE | ADDRE |
| CH4 | | | | |
| CH3 | | | | ADDRD |
| CH2 | | | ADDRC | ADDRC |
| CH1 | | ADDRB | ADDRB | ADDRB |
| CH0 | ADDRA | ADDRA | ADDRA | ADDRA |

▨ : SINGLE CONVERSION OPERATION
☐ : SCAN CONVERSION OPERATION

FIG. 14

| BIT | NAME | CONTENTS |
|---|---|---|
| 4 | PWMJ1 | NUMBER j OF INPUT CHANNELS ON WHICH THE AD CONVERSION OPERATION BY THE SINGLE ADSTPWM SETTING OPERATION IS CONDUCTED WITHIN CH0 THROUGH CH3, j≡3 IN THE CASE OF CH0 AND CH1, j=1 |
| 3 | PWMJ0 | |

ANALOG-DIGITAL CONVERTING DEVICE

BACKGROUND OF THE INVENTION

The present invention relates to an analog-digital converting device. More particularly, the present invention relates to an analog-digital converting device suitable for converting an analog quantity into a digital quantity, an inverter system which employs the same, and a microcomputer which employs the same.

A PWM inverter control system for controlling a motor is known. In this system, a PWM signal is generated on the basis of a motor current, and a PWM inverter is controlled according to the PWM signal. Since the motor current, an output current of the PWM inverter, pulsates, when the PWM inverter is controlled by the PWM signal, it is necessary for the fundamental wave components of the motor current to be detected and for the PWM signal to be generated on the basis of the detected value. For example, the vector control of an induction motor adopts an Id, Iq current control system in which a magnetic flux component current Id and a torque component current Iq are calculated from the motor current of each phase. Also, in the PWM inverter control system which employs vector control, in order to protect the components, it is necessary for an analog quantity, such as a temperature, to be detected in addition to the motor current. Hence, the aforementioned control systems generally employ a single chip microcomputer in which a CPU, a timer and a peripheral processing module, such as an AD conversion module, are incorporated, and the analog quantity is converted into a digital quantity by the incorporated AD conversion module.

The AD conversion module for detecting a plurality of analog quantities includes an analog multiplexer, a single sample holder, an AD converter and a register for storing the results of the conversion. The AD conversion module is designed to perform a single conversion operation in which AD conversion is conducted on a designated single analog quantity and a scan conversion operation in which AD conversion is conducted on a plurality of analog quantities in sequence. Scan conversion operation is generally used for detection of a motor current, and single conversion operation is employed for measurement of temperature or the like.

The method of detecting the fundamental wave component of a pulsating motor current has been proposed in, for example, Japanese Patent Laid-Open No. Sho 58-198165.

However, in the above-mentioned conventional techniques, concurrence of the scan conversion operation in which a motor current is converted into digital data, and the single conversion operation in which the temperature is converted into digital data is not taken into consideration. Thus, when the two conversion operations are instructed concurrently, the fundamental wave components of the motor current may not be reliably detected. That is, the scan conversion operation for detecting the motor currents is executed by the interrupt process which is synchronous with the PWM signal, and the single conversion operation for measurement of the temperature or the like is executed asynchronously with the scan conversion operation. Thus, when the scan conversion operation is requested while the single conversion operation in which the analog quantity, such as the temperature, is converted into digital quantity is being activated, the scan conversion operation may not be activated. In that case, the scan conversion operation is conducted after the single conversion operation is completed, and this precludes detection of the motor current synchronously with the PWM synchronous signal.

SUMMARY OF THE INVENTION

An object of the present invention is to provide an analog-digital converting device which gives priority to a conversion operation of a special analog signal over a conversion operation of another analog signal when the conversion operation in which the special analog signal is converted into digital quantity and the conversion operation in which another analog signal is converted into digital quantity are instructed concurrently, as well as an inverter system which employs such an analog-digital converting device.

To achieve the aforementioned object, the present invention provides an analog-digital converting device which comprises a multiplexer having a main channel for inputting a motor current signal and a sub channel for inputting an analog signal associated with the drive of a motor as analog signal input channels, the multiplexer selecting a plurality of designated channels in the channel group and putting out the analog signals of the selected channels, a plurality of sample holders for sampling and holding the output signals of the multiplexer, analog selection means for selecting the output signals of the sample holders in a designated order, an analog-digital converter for converting the signal selected by the analog selection means into a digital signal, a memory having a plurality of storage areas as an area in which the output signal of the analog-digital converter is stored, PWM signal generation means for generating a PWM signal according to the digital signal stored in the memory and for putting out the generated PWM signal at a designated period, PWM synchronous signal generation means for generating a PWM synchronous signal synchronously with the generation of the PWM signal, main channel selection instruction means for giving a main channel selection instruction to the multiplexer when it receives the PWM synchronous signal, sub channel selection instruction means for giving a sub-channel selection instruction to the multiplexer during a time other than the main channel selection period when it receives a signal which instructs selection of the analog signal input to the sub channel, and memory control means for designating a storage area corresponding to the selected channel as the storage area for storing the output signal of the analog-digital converter when the channel selection instruction is given to the multiplexer.

The present invention further provides an inverter system which comprises a PWM inverter for converting, according to a PWM signal, a direct current signal into an alternating current signal and for supplying the converted alternating current signal to a motor; current detection means for detecting a current which flows in the motor; and an analog-digital converting device for inputting a detection signal from the current detection means to a main channel thereof and for generating the PWM signal.

In the aforementioned analog-digital converting device, when there is a command to convert another analog signal input to the sub channel into a digital signal while the special analog signal input to the main channel is being converted into a digital signal, the conversion operation of the analog signal input to the sub channel is executed at a time other than the conversion operation period in which conversion is conducted on the analog signal input to the main channel. Thus, even when the conversion operations of the analog signals input to the main and sub channels are instructed concurrently, the conversion operation of the analog signal input to the main channel can be reliably performed. As a result, when the analog signal associated with the motor current is input to the main channel, the fundamental wave components of the pulsating motor current can be reliably detected.

Thus, a filter for detecting the fundamental wave components of the motor current can be eliminated, and the response of the current feed-back control operation in an inverter system which employs the aforementioned analog-digital converting device can be improved while the overall size of the system can be reduced.

BRIEF DESCRIPTION OF THE DRAWINGS

FIG. 4 illustrates the contents of an AD control register;

FIG. 8 illustrates the operation of the device shown in FIG. 1;

FIG. 14 illustrates the operation of the third embodiment.

DESCRIPTION OF THE PREFERRED EMBODIMENTS

An embodiment of the present invention will be described below with reference to the accompanying drawings.

Figure 1:
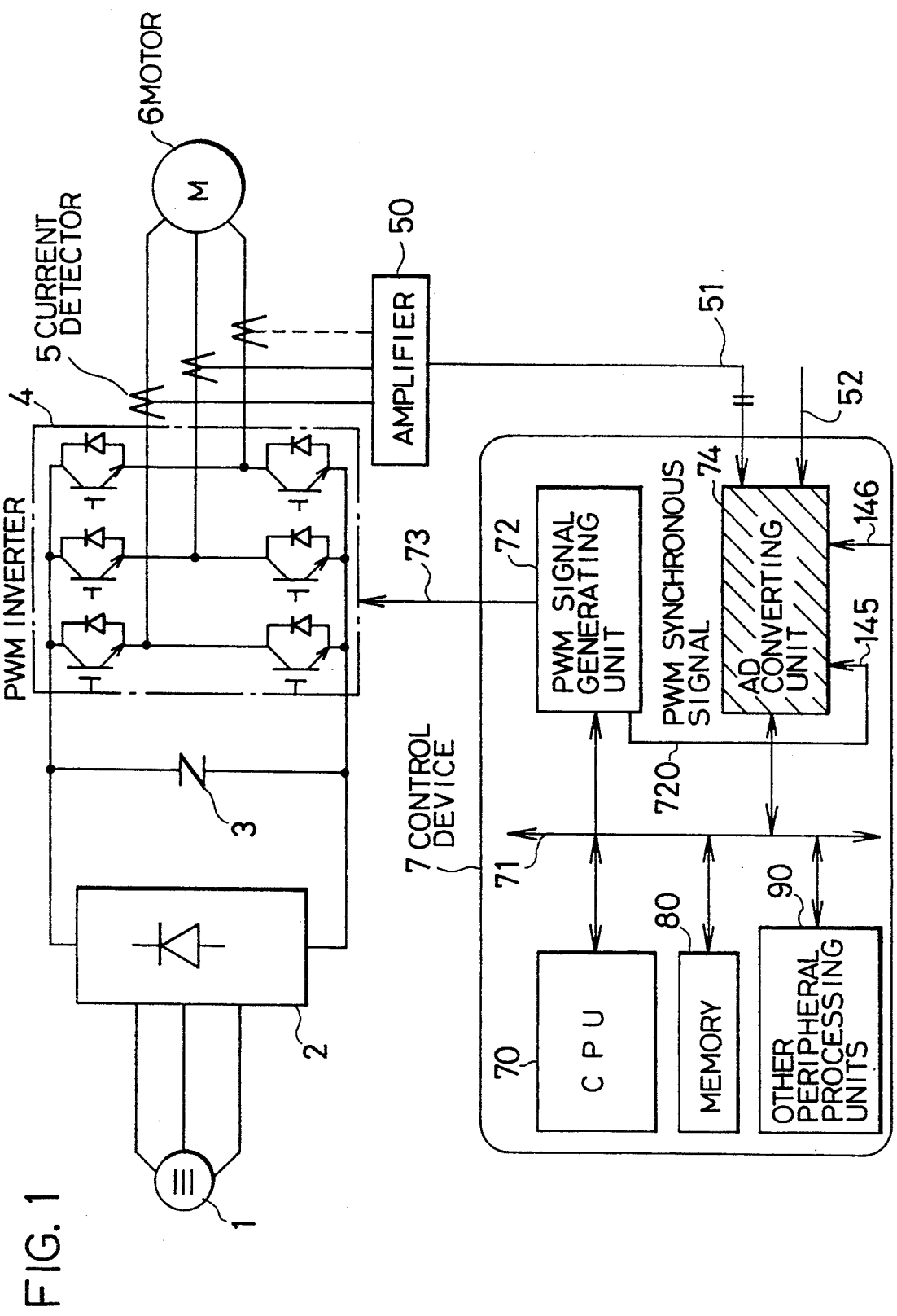
FIG. 1 is a PWM inverter control system illustrating an embodiment of the present invention.

FIG. 1 illustrates the structure of a PWM inverter control system according to the first embodiment of the present invention. In FIG. 1, a PWM inverter control system includes a three-phase power source 1, a rectifying device 2, a smoothing capacitor 3, a PWM inverter 4, a plurality of current detectors 5, an amplifier 50, and a control device 7. The rectifier 2 converts alternating-current power from the three-phase power source 1 into direct-current power. The converted direct-current power is supplied to the PWM inverter 4 through the smoothing capacitor 3. The PWM inverter 4 includes power elements each of which includes an insulated gate bipolar transistor (IGBT) and a diode which are parallel connected to each other, and converts the direct-current power to alternating-current power in response to a PWM signal 73 to drive a motor 6. The current which flows in the motor 6 is detected by the current detectors 5. The amplifier 50 amplifies the detected currents. The amplified current is input to the control device 7 as a motor current 51.

The control device 7, which is a single chip microcontroller, includes a CPU 70, a data bus 71, a PWM signal generating unit 72, an AD converting unit 74, a memory 80, and other peripheral processing units 90. The individual components of the control device 7 are connected with each other via a data bus 71. The CPU 70 executes various control operations according to the control operation program data stored in the memory 80 to control the PWM signal generating unit 72 and the AD converting unit 74.

Figure 2:
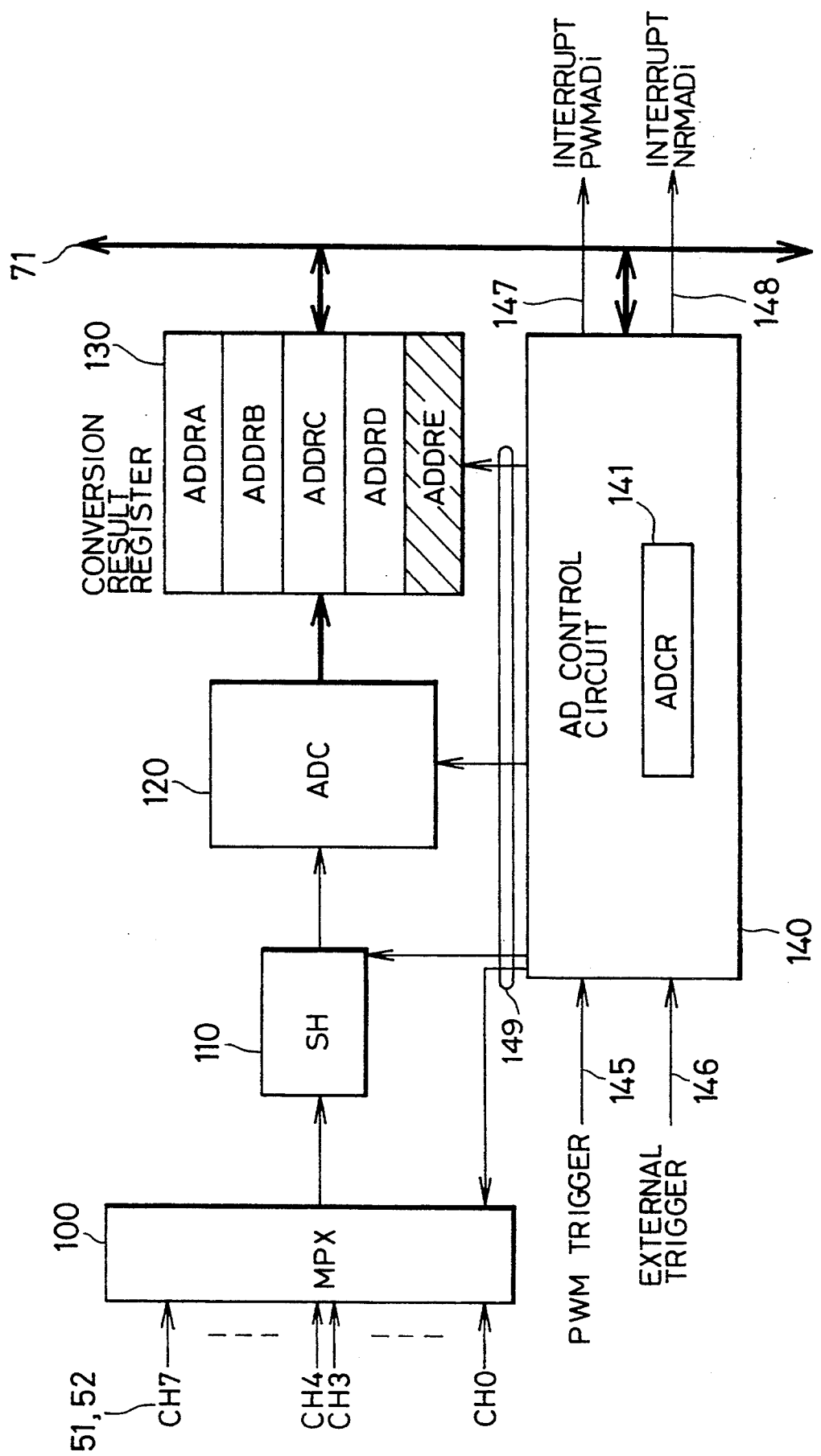
FIG. 2 illustrates the structure of an AD converting unit.

As shown in FIG. 2, the AD converting unit 74 includes an analog multiplexer 100, a sample holder 110, an AD converter 120, a conversion result register 130, and an AD control circuit 140. The conversion result register 130 and the AD control circuit 140 are connected with each other via the data bus 71. Fabrication of the aforementioned elements on the single semiconductor substrate in terms of the hardware enhances the response of the AD conversion operation. The analog multiplexer 100 has eight channels from channel CH0 to channel CH 7 as the analog signal input channel. Either the motor current 51 or an electric signal 52 representing another analog quantity is input to each of the channels. The analog multiplexer 100 selects a channel designated by a control signal 149 from the AD control circuit 140, and puts out the analog signal of the selected channel to the sample holder 110. The sample holder 110 samples and holds the analog signal input from the analog multiplexer 100 according to a control signal 149 from the AD control circuit 140, and transfers the signals which it holds to the AD converter 120 in sequence. The AD converter 120 converts the analog signal into a digital signal according to the control signal 149 from the AD control circuit 140, and transfers the converted digital signal to the conversion result register 130. The conversion result register 130 includes a plurality of registers ADDRA through ADDRE as the storage area for storing the digital signals.

Figure 3:
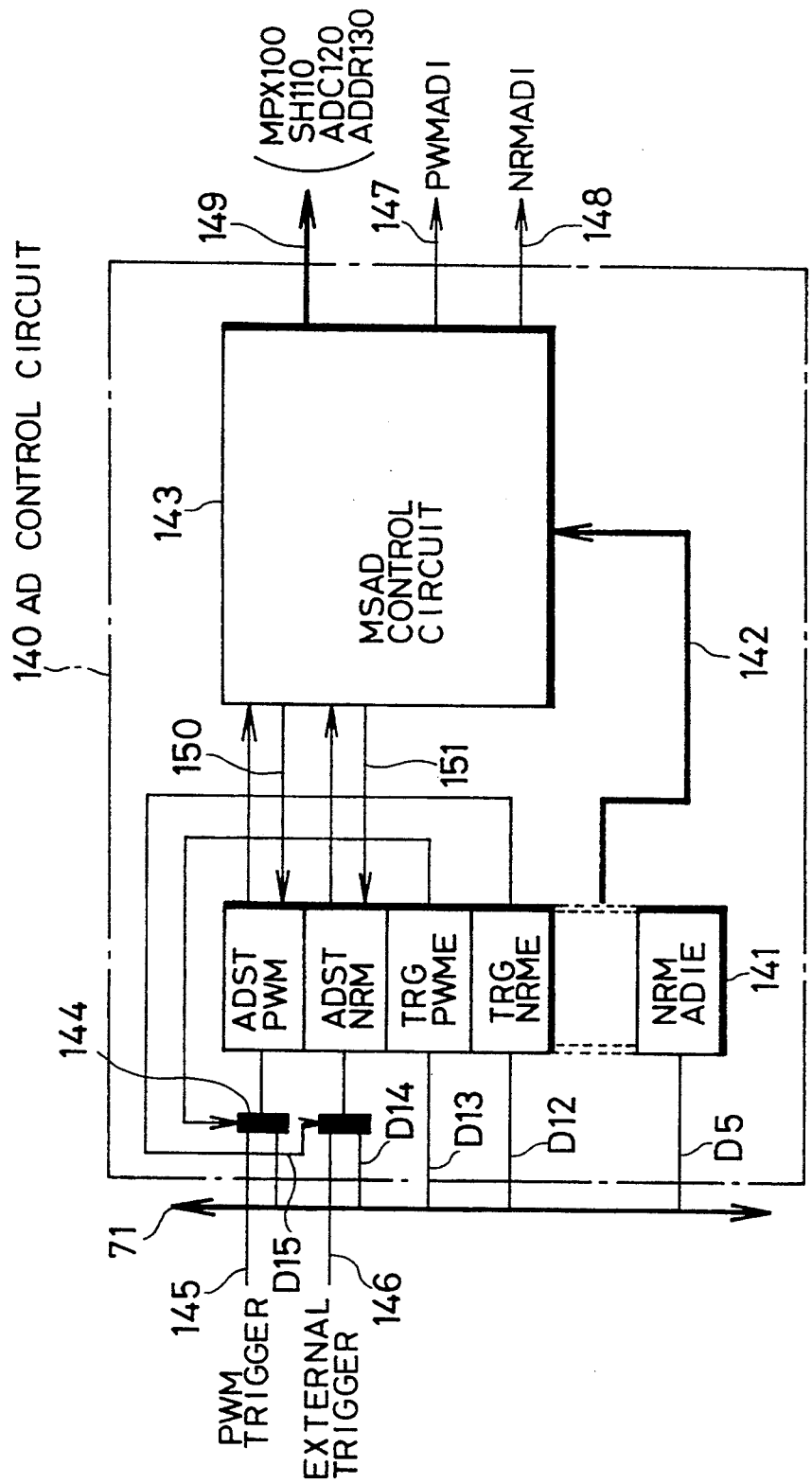
FIG. 3 illustrates the structure of an AD control circuit.

The AD control circuit 140 receives a PWM trigger 145 and an external trigger 146, and puts out the control signal 149 according to these trigger signals as well as two types of interrupt signals 147 and 148 to the CPU 70. Practically, the AD converting circuit 140 includes an AD control register 141, a MSAD control circuit 143, and gate elements 144, as shown in FIG. 3. In the AD control register 141, the name and contents of each of the bits shown in FIG. 4 are set.

In FIG. 4, ADSTPWM and ADSTNRM of bits 15 and 14 are an AD activating bit for detecting the motor current and an AD activating bit for detecting another analog quantity. ADSTPWM and ADSTNRM can be set in terms of the software by the instruction given from the CPU 70. ADSTPWM and ADSTNRM can also be set by the PWM trigger 145 and the external trigger 146. In the latter case, when the TRGPWM and TRGNRM of bits 13 and 12 are selected in terms of the software and the gate elements 144 are thereby turned on, the PWM trigger 145 and the external trigger 146 are generated, by which ADSTPWM and ADSTNRM are set. CH1PWM and CH0PWM of bits 11 and 10 are bits which set the number m of input channels for the scan conversion operation activated by ADSTPWM signal. CH2NRM through CH0NRM of bits 9 through 7 are bits which set the input channel k (m+1≦k≦7) designated for the single conversion operation activated by the ADSHNRM signal. PWMADiE and NRMADiE of bits 6 and 5 are enable or inhibit bit for the interrupt signal generated when the AD conversion operation is completed in the individual conversion operation. When both bits 11 and 10 are 0, channel CH0 is selected. When bit 11 is 0 while bit 10 is 1, channel CH1 is selected. When bit 11 is 1 while bit 10 is 0, channel CH2 is selected. When both bits 11 and 10 are 1, channel CH3 is selected.

Figure 5:
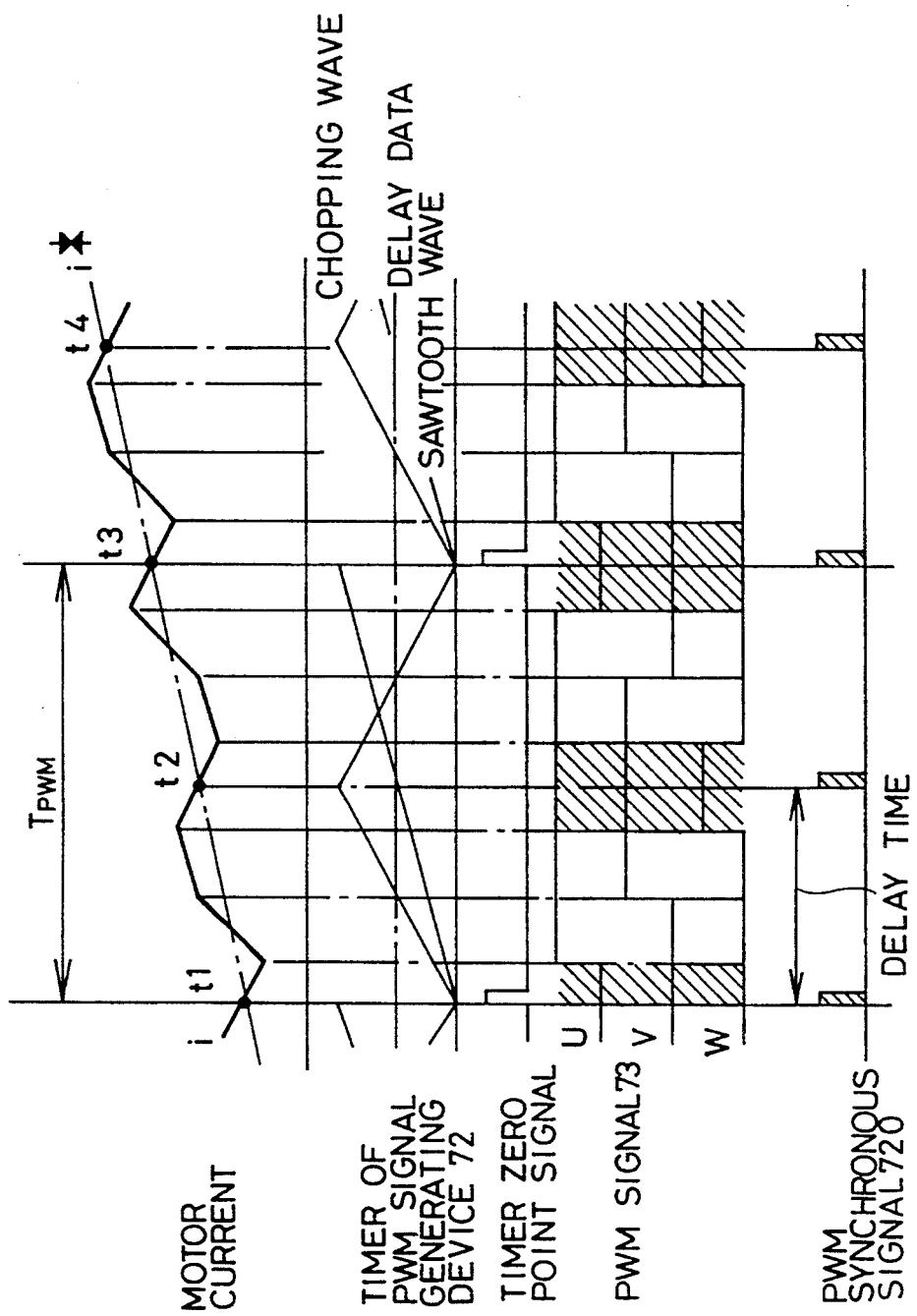
FIG. 5 illustrates the relation between a motor current and a PWM synchronous signal.

The PWM signal generating portion 72 and CPU 70 constitute the PWM signal generation means and the PWM synchronous signal generation means. The PWM signal generating portion 72 generates a PWM signal 73 and a PWM synchronous signal 720, as shown in FIG. 5. U, V, W signals shown in FIG. 5 are origin signals of the PWM signal. Six types of PWM signals 73 are generated on the basis of these origin signals through on-delay circuits (not shown) for preventing short-circuiting of the + and − switching elements of the PWM inverter 4. In order to generate the PWM synchronous signal 720 which is synchronous with the PWM period TPWM in response to the generation of the PWM signal 73, the PWM generating unit 72 includes a chopping wave signal generator for generating a chopping wave signal shown in FIG. 5, a timing signal generator for generating a timing signal when the level of the chopping wave signal is zero and at the maximum, and a pulse generator for generating a pulse synchronously with the generation of the timing signal. When the PWM synchronous signal 720 is generated at times t1 and t3 which are synchronous with the timer zero point signal synchronous with the PWM period and at time t2 or t4 which are midpoint between the times t1 and t3, all the PWM signals 73 are turned on or off. When all the PWM signals 73 are turned on or off, all the + and − switching elements of the PWM inverter 4 are turned on or off, and no voltage is applied to the motor 6. Consequently, a motor current flows through the diodes parallel-connected to the switching elements, and is thereby attenuated. Thus, it is possible to reliably detect the fundamental wave of the motor current by detecting the motor current at times t1, t2, t3 and t4 which are the midpoint of the period during which all the PWM signals 73 are on or off, i.e., which are synchronous with the PWM period.

Figure 6:
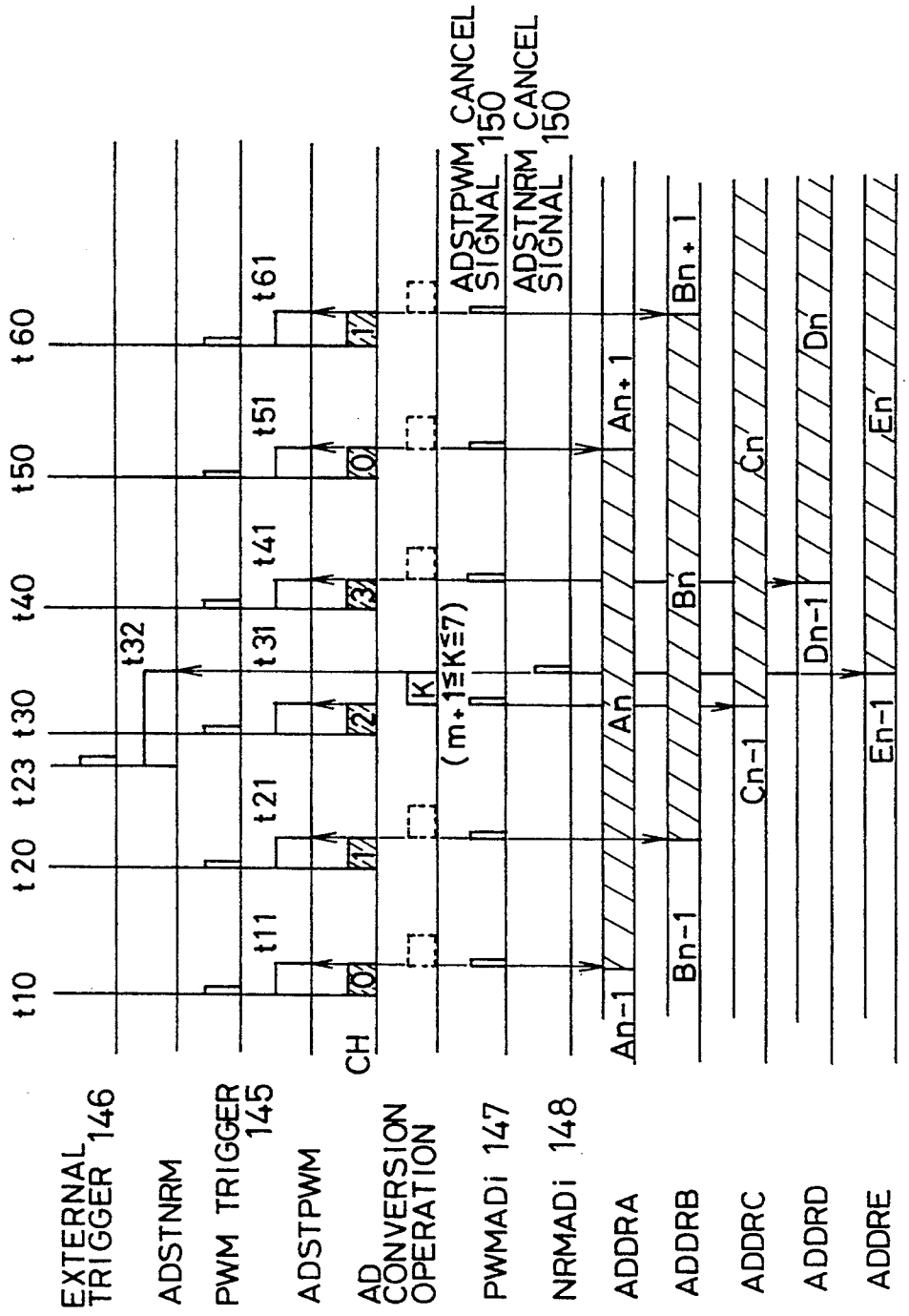
FIG. 6 is a time chart illustrating the operation of the components of the device shown in FIG. 1.
Figure 7:
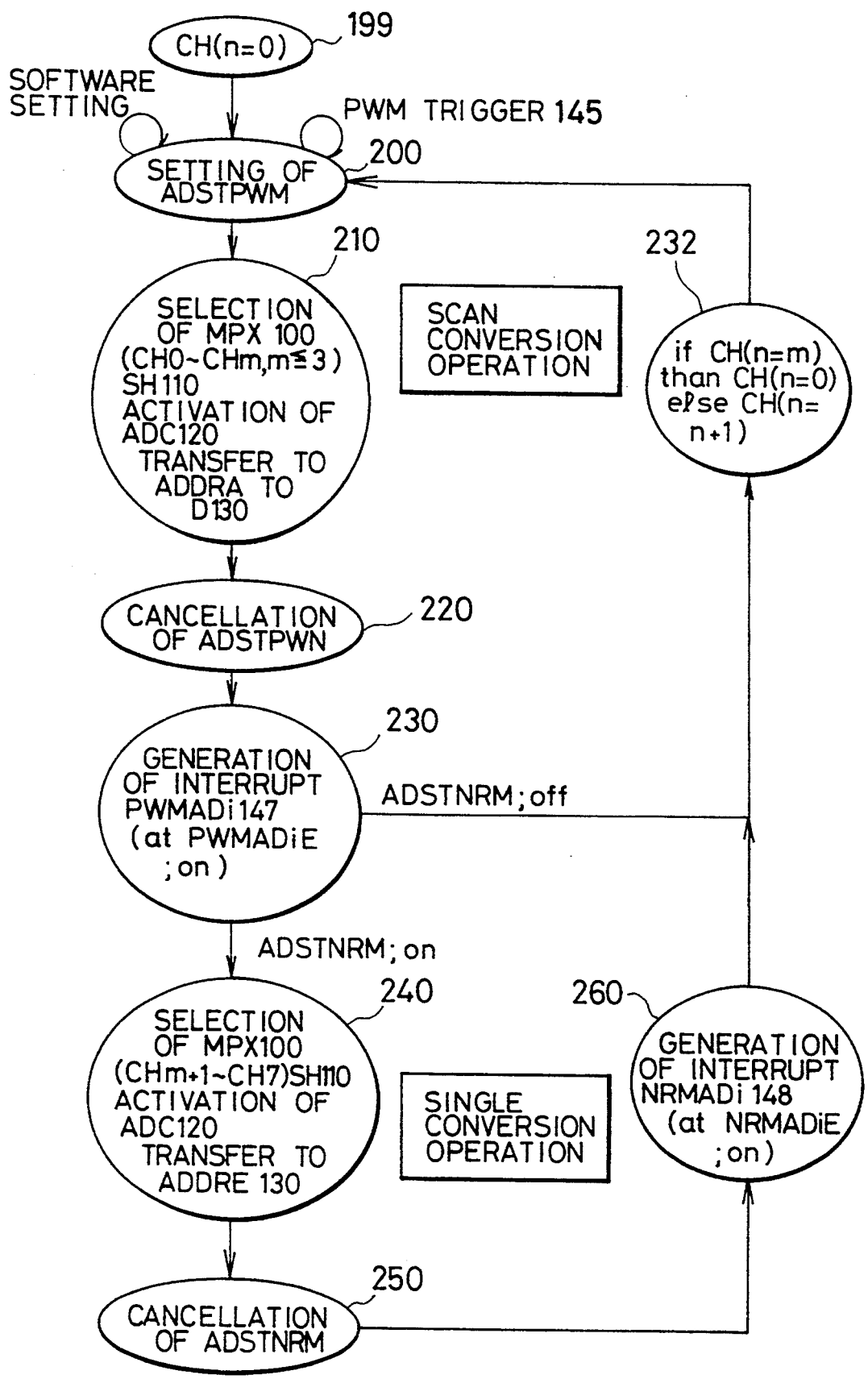
FIG. 7 is a flowchart illustrating the operation of the device shown in FIG. 1.

The PWM synchronous signal can also be generated at times t1, t2, t3 and t4 by a structure which includes a saw-tooth wave signal generator for generating a saw-tooth wave signal corresponding to the PWM period, a timing signal generator for generating a timing signal when the level of the saw-tooth wave signal is zero, at a maximum and at the midpoint between the zero level and the maximum level, and a PWM signal generator for generating the PWM signal synchronously with the generation of the timing signal, as shown in FIG. 5. Furthermore, a delay signal which is delayed by a set time from the timer zero point signal generated when the timer operation is the saw-tooth wave operation can be used as the timing signal. The use of this delay signal enables a PWM inverter control system in which a direct-current motor is driven by a H type bridge circuit to detect the fundamental wave component of the motor current at the midpoint of the width of the PWM signal from an intermittent current (which contains both the motor current and zero current) which is synchronous with the width of the PWM signal. Next, the AD conversion operation according to the present invention which is activated by the PWM synchronous signal 720 generated at times t1 and t3 as the PWM trigger 145 will be described below with reference to FIGS. 6 and 7. FIG. 8 shows the relation between the channels CH0 through CH7 of the analog multiplexer 100 and the registers of the conversion result register 130.

In FIG. 8, when the number m of input channels is 0, AD conversion operation is performed on channel CH0 alone each time ADSTPWM is generated. The results of the AD conversion operation are stored in register ADDRA. The analog signal input to other channels CH1 through CH7 is AD converted under the condition that the ADSTNRM is generated. The results of the AD conversion operation are stored in register ADDRE. When the number m of input channels is 3, AD conversion is conducted using channels CH0 through CH3 as the main channels and the other channels as the sub-channels. That is, each time ADSTPWM is generated, AD conversion operation is conducted sequentially on channels CH0 through CH3 starting with channel CH0. After the AD conversion is conducted on channel CH3, conversion is conducted on channel CH0 again. In other words, scan conversion operation is repeated. Single conversion operation is conducted on the analog signals input from the other sub-channels. The results of the single conversion operation are stored in register ADDRE.

First, the initial process of the PWM inverter control system is conducted, i.e., the input channel CH0 of the analog multiplexer 100 is selected, in step 199. Next, in step 200, setting of AD conversion starting bit ADSTPWM of the AD control register 141 is awaited. ADSTPWM is set by the PWM trigger 145 when the setting selection signal TRGPWM selects the PWM trigger 145. Thus, when the PWM trigger signal is obtained from the PWM synchronous signal 720 shown in FIG. 5, ADSTPWM is set synchronously with the PWM synchronous signal 720. When the PWM trigger 145 is generated at time t10, channel CH0 is selected in step 210, the analog signal input to channel CH0 is input to the sample holder 110, the output signal of the sample holder 110 is transferred to the AD converter 120, and the AD conversion operation is executed. At time t11 when the AD conversion operation is completed, the results of the conversion is stored in the register ADDRA. Thereafter, a cancel signal 150 is generated to cancel ADSTPWM. If an enabling signal PWMADiE is set in step 230, an interrupt signal PWMADi147 is generated.

If ADSTNRM (off) which designates the single conversion operation is not set at time t11, a subsequent input channel CH1 is selected and the process returns to step 200.

By repeating the above-described series of processes, channels CH0 through CH3 are selected in that order synchronously with the PWM trigger 145 generated at times t10, t20, t30, t40 and t50, and the analogs signal on the selected channels are sequentially converted into digital signals to repeat the scan conversion operation.

If ADSTNRM (on) is set at time t23 by the external trigger 146 or software setting, the single conversion operation is not executed at once at time t23 but the AD conversion operation on channel CH2 is conducted by the PWM trigger 145 generated at time t30. Thereafter, the single conversion operation is conducted. In that case, the AD conversion operation of the input channel CHk designated by CH2NRM through CH0NRM of the AD control register 141 is executed in step 240. Next, in step 250, ADSTNRM is cancelled. If an enabling signal NRMADiE has been set, an interrupt signal NRMADi148 is output in step 260. Thereafter, the input channel is updated in step 232, and then the process returns to step 200.

The CPU 70 obtains the digital values obtained by the aforementioned AD conversion operation when it reads in the conversion result register 130 through the control operation process. The CPU 70 may also reads in the digital values through the interrupt process conducted by the interrupt signals PWMADi147 and NRMADi148. With the overhead of the interrupt processes which occur frequently in the CPU 70 be taken into consideration, the latter method is advantageous over the former one.

In this embodiment, since priority is given to the scan conversion operation over the single conversion operation, the fundamental wave components of the motor current input to the main channel can be reliably detected.

Figure 9:
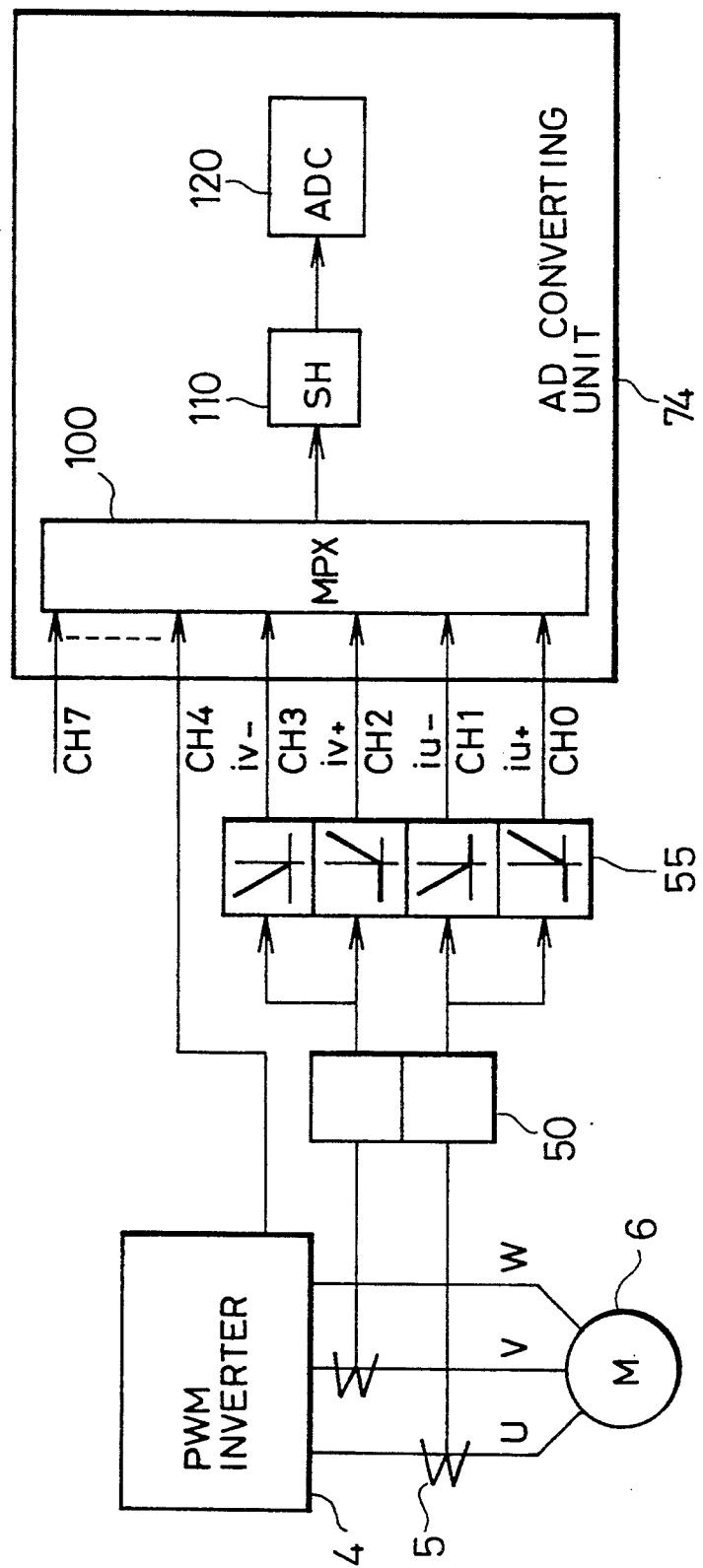
FIG. 9 shows a second embodiment of the present invention.

If the AD converter 120 incorporated in the single chip microcomputer is of the single-pole type which conducts the AD conversion operation only on the positive voltage while the motor current is an alternating current, as shown in FIG. 9, an absolute value circuit 55 is inserted between the current amplifier 50 and the analog multiplexer 100. In that case, the number of current detectors 5 can be minimized by detecting only U and V phase currents iu and iv and by obtaining W phase current iw by the software. The absolute value circuit 55 converts the U and W phase currents into iu+, iu− and iv+, iv−, respectively. The converted currents are input to the individual channels of the analog multiplexer 100. Currents iu+ through iv− are respectively input to channels CH0 through CH3, while the analog signal 52 representing the temperature of the power element of the PWM inverter 4 is input to channel CH4.

Figure 10:
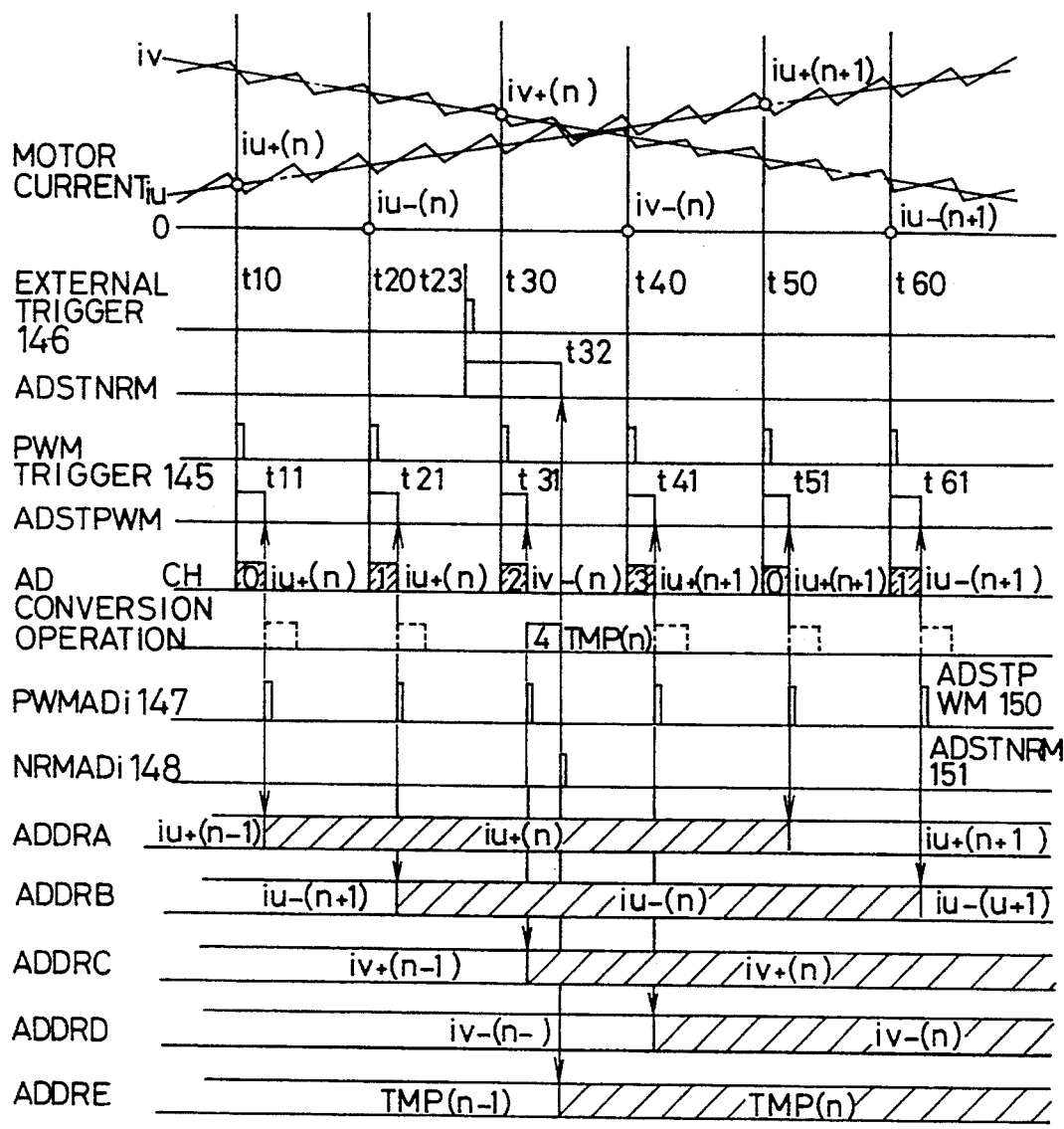
FIG. 10 is a time chart illustrating the operation of the second embodiment.

The AD conversion operation by the device shown in FIG. 9 will be described below in detail with reference to FIG. 10.

When ADSTPWM is set, currents iu+, iu−, iv+ and iv− of channels CH0 through CH3 are sequentially selected at times t10, t20, t30 and t40, respectively, and the scan conversion operation in which the selected currents are converted into digital values is executed. When ADSTNRM is set at time t23 to detect temperature TMP while the aforementioned scan conversion operation is being executed, the AD conversion operation of current iv+ is conducted first at time t30 and then the AD conversion operation of temperature TMP is executed at time t31. The results of the AD conversion are stored in sequence in registers ADDRA through ADDRE of the conversion result register 130 each time the conversion operation is conducted. Thus, motor currents iu+ through iv− in the conversion result register 130 are updated each time four PWM triggers 145 are generated. When necessary, the CPU 70 reads the registers in the conversion result register 130 and thereby obtains these digital values. In FIG. 10, only the fundamental wave components of the motor currents are shown.

If the AD converter 120 is of the type which is capable of conducting conversion on both positive and negative voltages, since it can conduct conversion directly on the alternating current, the provision of the absolute value circuit 55 is eliminated.

Figure 11:
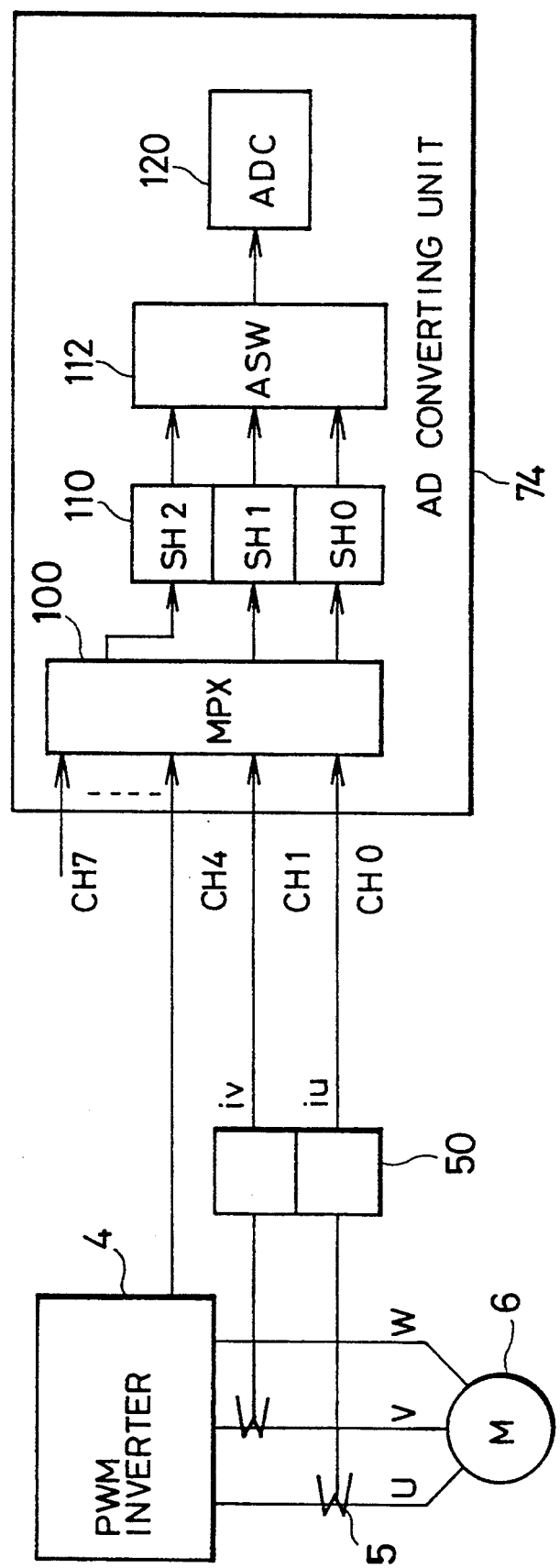
FIG. 11 shows a third embodiment of the present invention.

An embodiment in which the motor currents of different phases are detected concurrently will be described below with reference to FIGS. 11 through 13.

In this embodiment, sample holders SH0, SH1 and SH2 for three channels and an analog switch 112 are provided between the analog multiplexer 100 and the AD converter 120. The motor currents input to the channels CH0 and CH1 of the analog multiplexer 100 are respectively supplied to the sample holders SH0 and SH1, while the analog signal input to the other channel is supplied to the sample holder SH2. In the AD control register 141, bits shown in FIG. 14 are set.

In FIG. 14, bits 3 and 4 represent the number of input channels on which the AD conversion operation is conducted each time ADSTPWM is set once. FIG. 12 shows the set values of the AD control register 141, that is, the case in which CH*PWM m=1, CH*NRM is 4, and PWMJ* j=1 (which means that the AD conversion operation is continuously executed on two channels). A relation between the input channels and the registers of the conversion result register 130, obtained when m=1 shown in FIG. 8, is employed. That is, in the embodiment shown in FIG. 12, only two channels CH0 and CH1 are selected.

Figure 12:
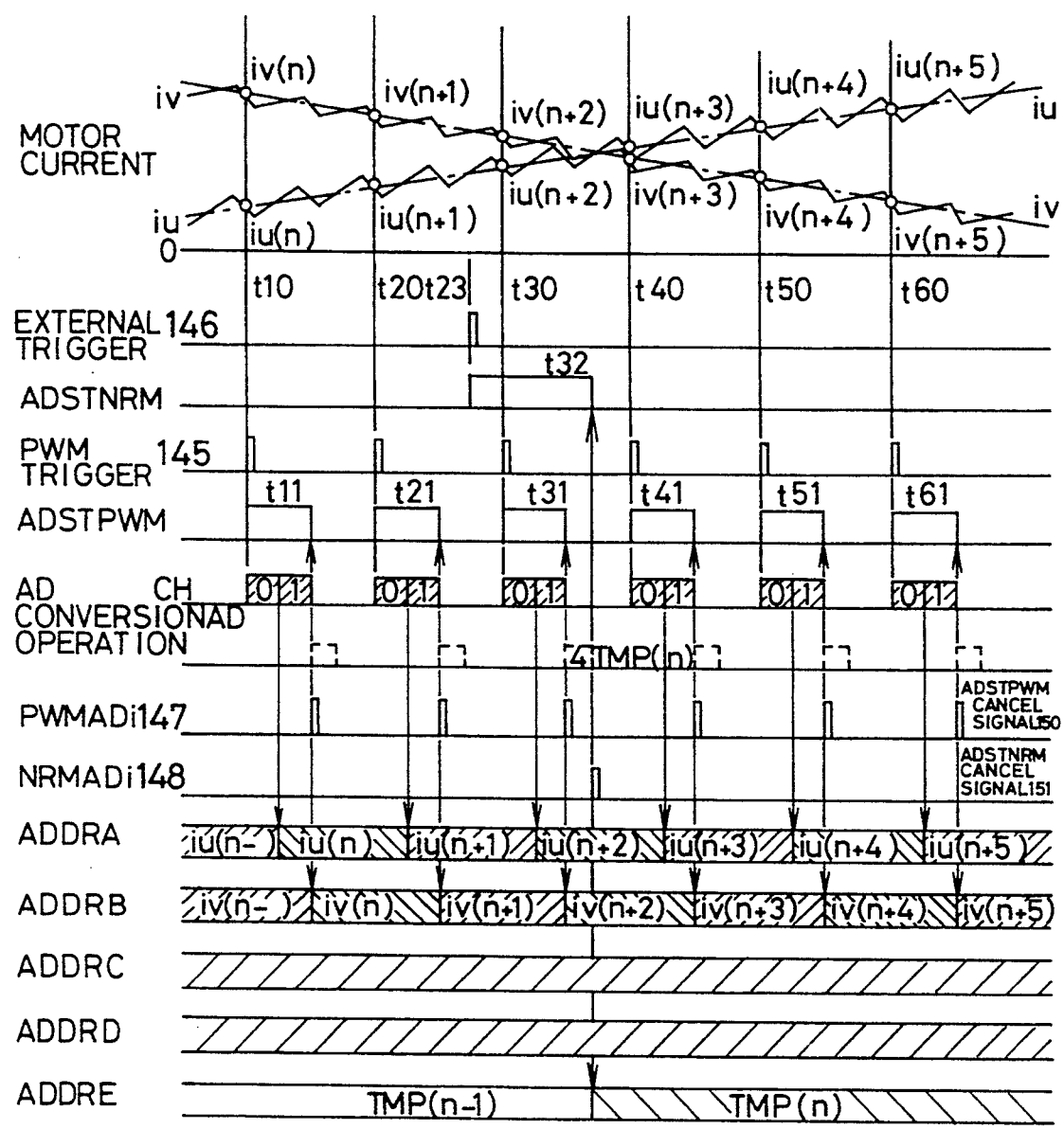
FIG. 12 is a time chart illustrating the operation of the third embodiment.
Figure 13:
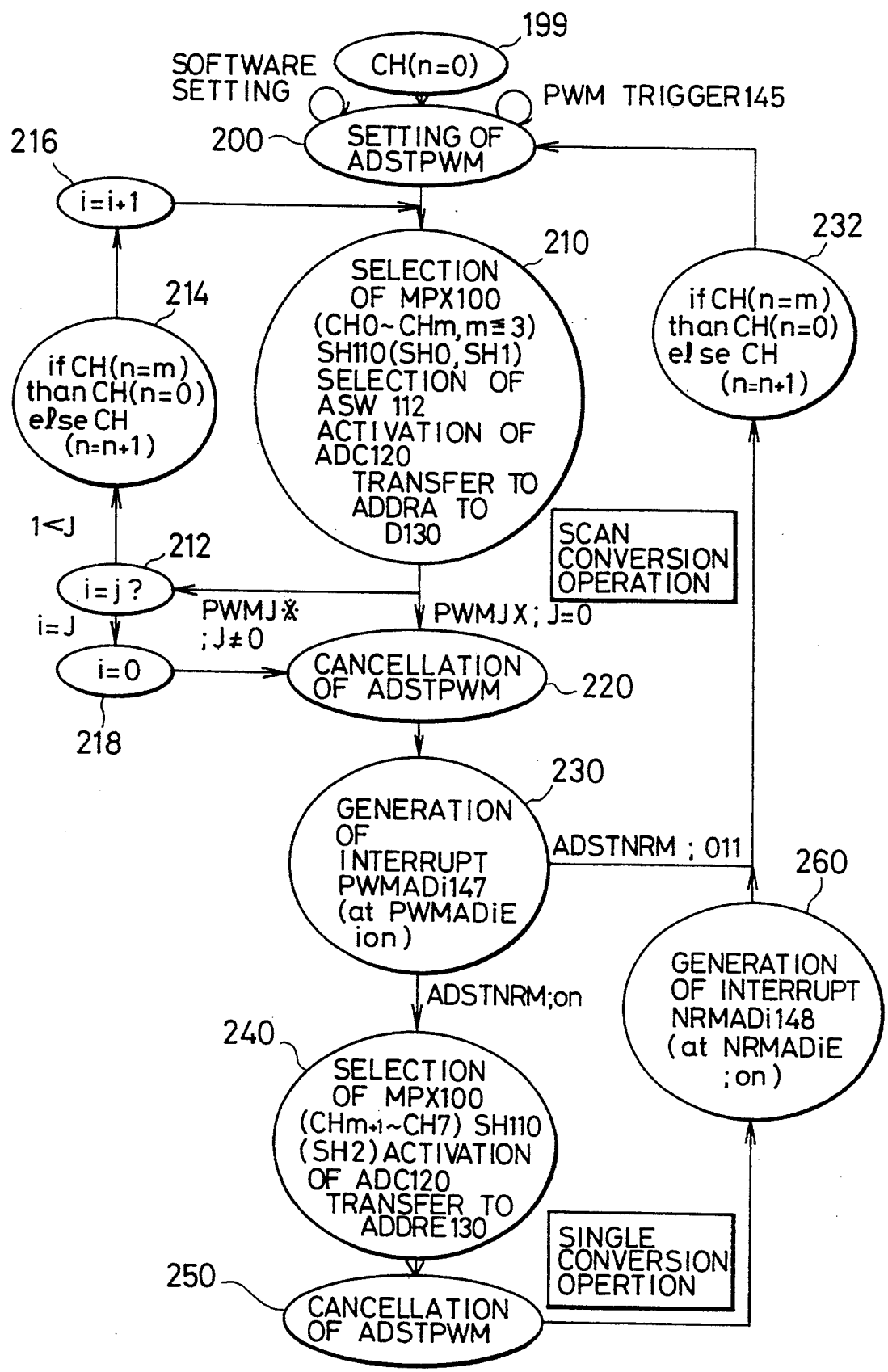
FIG. 13 is a flowchart illustrating the operation of the third embodiment.

In the aforementioned structure, when ADSTPWM is set at time t10 shown in FIG. 12, motor currents for two channels are input from the analog multiplexer 100 in step 210 of FIG. 13. That is, channels CH0 and CH1 are selected, and the motor currents iu (m) and iv (n) input to the channels are concurrently held in the sample holders SH0 and SH1, respectively. Thereafter, the output signal of the sample holder SH0 corresponding to channel CH0 is selected by the analog switch 112, the selected analog signal is converted into a digital signal, and the results of the conversion are stored in the register ADDRA. At that time, since PWMJ* j=1, the number of times i that AD conversion is conducted when ADSTPWM is set once is determined from the set value j of PWMJ*. If i<j, input channel CH (n) and the number of times i are updated in steps 214 and 215, respectively, and the AD conversion operation on channel 1 is executed. If i=j, i=0 in step 128, and an interrupt is generated in step 220.

The aforementioned process is executed each time PWM trigger 145 is generated. When ADSTNRM is set at time t23, the AD conversion operation which is initiated at time t30 is completed at time t32, and at that time the AD conversion operation of temperature TMP input to channel CH3 is initiated.

In the above-mentioned embodiment, temperature TMP input at time t31 is held in the sample holder SH2 through the analog multiplexer 100 in step 240. However, it may also be arranged such that selection by the analog multiplexer 100 is executed at time t23 at which ADSTNRM is set, and that temperature TMP is held in the sample holder SH2 at that time.

Furthermore, in the above embodiment, since the control device 7 is constituted by a single chip micro controller with the CPU 70 as a core, the overall size of the AD converting unit can be reduced.

As will be understood from the foregoing description, in the present invention, since priority is given to the AD conversion operation of the analog signal input to the main channel over the AD conversion operation of the analog signal input to the sub channel, the AD conversion operation can be reliably executed on the special analog signal without being affected by the AD conversion operation conducted on another analog signal. The motor currents are input to the main channels. This enables reliable detection of other analog quantities and the fundamental wave components of the pulsating motor currents.

Consequently, a filter for detecting the fundamental wave components of the motor current is not necessary, and the response of the current feed-back control operation in the inverter system which employs the analog digital converting device can thus be improved while the size of the system can be reduced.

What is claimed is:

1. An analog-digital converting device comprising:
   a multiplexer having a main channel and a sub channel as analog signal input channels, said multiplexer selecting a designated channel in said channel group and putting out the analog signal of the selected channel;
   a sample holder for sampling and holding the output signal of said multiplexer;
   an analog-digital converter for converting the output signal of said sample holder into a digital signal;
   a memory having a plurality of storage areas each storing the output signal of said analog-digital converter;
   main channel selection instruction means for giving a main channel selection instruction to said multiplexer when it receives a synchronous signal associated with the generation of the analog signal input to the main channel;
   sub channel selection instruction means for giving a sub channel selection instruction to said multiplexer during a time other than the main channel selection period when it receives a signal which instructs selection of the analog signal input to the sub channel; and
   memory control means for designating a storage area corresponding to the selected channel as the storage area for storing the output signal of said analog-digital converter when the channel selection instruction is given to said multiplexer.

2. An analog-digital converting device comprising:
   a multiplexer having a main channel for inputting a motor current signal and a sub channel for inputting an analog signal associated with the drive of a motor as analog signal input channels, said multiplexer selecting a designated channel in said channel group and putting out the analog signal of the selected channel;
   a sample holder for sampling and holding the output signal of said multiplexer;
   an analog-digital converter for converting the output signal of said sample holder into a digital signal;
   a memory having a plurality of storage areas as an area in which the output signal of said analog-digital converter is stored;
   main channel selection instruction means for giving a main channel selection instruction to said multiplexer when it receives a synchronous signal associated with the drive of said motor;
   sub channel selection instruction means for giving a sub channel selection instruction to said multiplexer during a time other than the main channel selection period when it receives a signal which instructs selection of the analog signal input to the sub channel; and
   memory control means for designating a storage area corresponding to the selected channel as the storage area for storing the output signal of said analog-digital converter when the channel selection instruction is given to said multiplexer.

3. An analog-digital converting device according to at least one of claims 1 through 2, wherein the individual components are fabricated on the same semiconductor substrate.

4. An analog-digital converting device comprising:
   a multiplexer having a main channel for inputting a motor current signal and a sub channel for inputting an analog signal associated with the drive of a motor as analog signal input channels, said multiplexer selecting a designated channel in said channel group and putting out the analog signal of the selected channel;
   a sample holder for sampling and holding the output signal of said multiplexer;
   an analog-digital converter for converting the output signal of said sample holder into a digital signal;
   a memory having a plurality of storage areas each storing the output signal of said analog-digital converter;
   PWM signal generation means for generating a PWM signal according to the digital signal stored in said memory and putting out the generated PWM signal at a designated period;
   PWM synchronous signal generation means for generating a PWM synchronous signal synchronously with the generation of the PWM signal;
   main channel selection instruction means for giving a main channel selection instruction to said multiplexer when it receives the PWM synchronous signal;
   sub channel selection instruction means for giving a sub channel selection instruction to said multiplexer during a time other than the main channel selection period when it receives a signal which instructs selection of the analog signal input to the sub channel; and
   memory control means for designating a storage area corresponding to the selected channel as the storage area for storing the output signal of said analog-digital converter when the channel selection instruction is given to said multiplexer.

5. An analog-digital converting device comprising:
   a multiplexer having a plurality of main channels for inputting motor current signals and a sub channel for inputting an analog signal associated with the drive of a motor as analog signal input channels, said multiplexer selecting a designated channel in said channel group and putting out the analog signal of the selected channel;
   a sample holder for sampling and holding the output signal of said multiplexer;
   an analog-digital converter for converting the output signal of said sample holder into a digital signal;
   a memory having a plurality of storage areas each storing the output signal of said analog-digital converter;
   PWM signal generation means for generating a PWM signal according to the digital signal stored in said memory and putting out the generated PWM signal at a designated period;
   PWM synchronous signal generation means for generating a PWM synchronous signal synchronously with the generation of the PWM signal;

main channel selection instruction means for instructing a scan conversion operation in which said main channels are sequentially selected to said multiplexer when it receives the PWM synchronous signal;

sub channel selection instruction means for instructing a single conversion operation in which only the sub channel is selected during a time other than the main channel selection period to said multiplexer when it receives a signal which instructs selection of the analog signal input to the sub channel; and memory control means for designating a storage area corresponding to the selected channel as the storage area for storing the output signal of said analog-digital converter when the channel selection instruction is given to said multiplexer.

6. An analog-digital converting device comprising:

a multiplexer having a main channel for inputting a motor current signal and a sub channel for inputting an analog signal associated with the drive of a motor as analog signal input channels, said multiplexer selecting a plurality of designated channels in said channel group and putting out the analog signals of the selected channels;

a plurality of sample holders for sampling and holding the output signals of said multiplexer;

analog selection means for selecting the output signals of said sample holders in a designated order;

an analog-digital converter for converting the signal selected by said analog selection means into a digital signal;

a memory having a plurality of storage areas each storing the output signal of said analog-digital converter;

PWM signal generation means for generating a PWM signal according to the digital signal stored in said memory and putting out the generated PWM signal at a designated period;

PWM synchronous signal generation means for generating a PWM synchronous signal synchronously with the generation of the PWM signal;

main channel selection instruction means for giving a main channel selection instruction to said multiplexer when it receives the PWM synchronous signal;

sub channel selection instruction means for giving a sub channel selection instruction to said multiplexer during a time other than the main channel selection period when it receives a signal which instructs selection of the analog signal input to the sub channel; and memory control means for designating a storage area corresponding to the selected channel as the storage area for storing the output signal of said analog-digital converter when the channel selection instruction is given to said multiplexer.

7. An analog-digital converting device comprising:

a multiplexer having a plurality of main channels for inputting motor current signals and a sub channel for inputting an analog signal associated with the drive of a motor as analog signal input channels, said multiplexer selecting a plurality of designated channels in said channel group and putting out the analog signals of the selected channels;

a plurality of sample holders for sampling and holding the output signals of said multiplexer;

analog selection means for selecting the output signals of said sample holders in a designated order;

an analog-digital converter for converting the signal selected by said analog selection means into a digital signal;

a memory having a plurality of storage areas each storing the output signal of said analog-digital converter;

PWM signal generation means for generating a PWM signal according to the digital signal stored in said memory and putting out the generated PWM signal at a designated period;

PWM synchronous signal generation means for generating a PWM synchronous signal synchronously with the generation of the PWM signal;

main channel selection instruction means for instructing a scan conversion operation in which the main channels are sequentially selected to said multiplexer each time it receives the PWM synchronous signal;

sub channel selection instruction means for instructing a single conversion operation in which only the sub channel is selected during a time other than the main channel selection period to said multiplexer when it receives a signal which instructs selection of the analog signal input to the sub channel; and memory control means for designating a storage area corresponding to the selected channel as the storage area for storing the output signal of said analog-digital converter when the channel selection instruction is given to said multiplexer.

8. An analog-digital converting device according to either of claims 4, 5, 6 and 7, wherein said PWM synchronous signal generation means includes a chopping wave signal generator for generating a chopping wave signal corresponding to the PWM period, a timing signal generator for generating a timing signal when the level of the chopping wave signal is at zero and at a maximum, and a pulse signal generator for generating a pulse signal synchronously with the generation of the timing signal.

9. An analog-digital converting device according to either of claims 4, 5, 6 and 7, wherein said PWM synchronous signal generation means includes a saw-tooth wave signal generator for generating a saw-tooth wave signal corresponding to the PWM period, a timing signal generator for generating a timing signal when the level of the saw-tooth wave signal is at zero, at a maximum and at a given level between the zero level and the maximum level, and a PWM signal generator for generating a PWM signal synchronously with the generation of the timing signal.

10. An analog-digital converting device according to either of claims 1, 2, 4, 5, 6 and 7, further comprising absolute value output means for outputting only an absolute value component of the analog signal input to at least the main channel, said absolute value output means being disposed on an input side of said multiplexer.

11. An inverter system comprising:

a PWM inverter for converting a direct current signal into an alternating current signal according to a PWM signal and for supplying the converted alternating current signal to a motor;

current detection means for detecting a current which flows in said motor; and an analog-digital converting device for inputting a detection signal from said current detection means to a main channel thereof and for generating the PWM signal, said analog-digital converting device being said analog-digital converting device set forth in either of claims 4 through 10.

12. A microcomputer comprising:
a main memory for storing control operation program data;
a CPU for executing a control operation on the basis of the control operation program data stored in said main memory; and
analog-digital converting device for converting an analog signal into a digital signal according to an instruction of said CPU, said analog-digital converting device being said analog-digital converting device set forth in either of claims 1 through 2.

* * * * *